(12) United States Patent
Ishizu

(10) Patent No.: US 7,964,899 B2
(45) Date of Patent: Jun. 21, 2011

(54) SEMICONDUCTOR DEVICE AND METHOD FOR MANUFACTURING THE SAME FOR IMPROVING THE PERFORMANCE OF MIS TRANSISTORS

(75) Inventor: Tomoyuki Ishizu, Kyoto (JP)

(73) Assignee: Panasonic Corporation, Osaka (JP)

( * ) Notice: Subject to any disclaimer, the term of this patent is extended or adjusted under 35 U.S.C. 154(b) by 898 days.

(21) Appl. No.: 11/653,326

(22) Filed: Jan. 16, 2007

(65) Prior Publication Data
US 2007/0221962 A1 Sep. 27, 2007

(30) Foreign Application Priority Data

Mar. 22, 2006 (JP) .................. 2006-078524

(51) Int. Cl.
*H01L 27/148* (2006.01)
*H01L 29/04* (2006.01)
(52) U.S. Cl. .................. 257/255; 257/627; 257/628
(58) Field of Classification Search .................. 257/255, 257/627, 628, E29.004
See application file for complete search history.

(56) References Cited

U.S. PATENT DOCUMENTS

| 7,405,436 B2* | 7/2008 | Chidambarrao et al. ...... 257/204 |
| 2004/0217448 A1* | 11/2004 | Kumagai et al. .............. 257/627 |
| 2005/0285150 A1 | 12/2005 | Birner et al. |

FOREIGN PATENT DOCUMENTS

JP 2004-87640 3/2004

OTHER PUBLICATIONS

Jaeger, et al., "CMOS Stress Sensors on (100) Silicon," IEEE Journal of Solid-State Circuits, Jan. 2000, pp. 85-95, vol. 35, No. 1, IEEE.

* cited by examiner

*Primary Examiner* — Hung Vu
(74) *Attorney, Agent, or Firm* — McDermott Will & Emery LLP

(57) ABSTRACT

An active region and an isolation region are formed in the surface of a silicon semiconductor substrate having a (100) crystal plane as a principal surface. A gate insulating film and a gate electrode are formed on the active region in this order. A stress control film is formed to cover part of the active region where the gate electrode is not formed, the isolation region, the top surface of the gate electrode and sidewalls. A pair of stress control regions are formed to sandwich the gate electrode in the gate width direction of the gate electrode. In the stress control regions, the stress control film is not formed, or alternatively, a stress control film thinner than the stress control film formed on the gate electrode is formed.

6 Claims, 11 Drawing Sheets

SEMICONDUCTOR DEVICE AND METHOD FOR MANUFACTURING THE SAME FOR IMPROVING THE PERFORMANCE OF MIS TRANSISTORS

BACKGROUND OF THE INVENTION

1. Field of the Invention

The present invention relates to a semiconductor device and a method for manufacturing the same. In particular, it relates to a semiconductor device and a method for manufacturing the same intended for improving the performance of MIS transistors.

2. Description of Related Art

In recent years, there has been huge demand for increasing the operating speed of MIS transistors for the purpose of improving processing capacity of semiconductor devices, such as LSIs. A preferable way to increase the operating speed of the MIS transistors is to improve current characteristics of the MIS transistors. The MIS transistors have been miniaturized for the improvement in current characteristics. However, this is accompanied by increase in parasitic resistance and concentration in a substrate, thereby reducing carrier mobility. It could be said that the miniaturization of the MIS transistors cannot improve the current characteristics of the MIS transistors any more.

As an alternative to the miniaturization of the MIS transistors, there is a known technique as explained below (e.g., see Japanese Unexamined Patent Publication No. 2004-87640 and IEEE Journal of Solid-State Circuits, Vol. 35, No. 1, January 2000). For n-type MIS transistors, there is a known technique of depositing a stress control film such as a nitride film having internal tensile stress on the n-type MIS transistors. This makes it possible to apply tensile stress to channels of the n-type MIS transistors, thereby improving the carrier mobility in the n-type MIS transistors.

According to a known technique for p-type MIS transistors, the MIS transistors are arranged on a substrate such that the channel length direction of the MIS transistors is substantially parallel to the <100> crystallographic axis direction of the substrate, not to the <110> crystallographic axis direction. This improves the carrier mobility in the p-type MIS transistors.

Further, there has been considered a method for realizing a semiconductor device by bringing the channel length direction of the MIS transistors substantially parallel to the <100> crystallographic axis direction of the substrate and depositing a tensile stress control film on the MIS transistors. According to the method, both of the n- and p-type MIS transistors are improved in current characteristics.

SUMMARY OF THE INVENTION

A first semiconductor device of the present invention includes: a MIS transistor including an active region formed in part of a surface of a semiconductor substrate, a gate electrode formed on the active region and source and drain regions formed in the active region; an insulating film covering at least the source region, the drain region and the gate electrode; and a pair of stress control regions formed on parts of the semiconductor substrate sandwiching the gate electrode in the gate width direction of the gate electrode, wherein the direction of the length of a channel connecting the source region and the drain region is parallel to the <100> crystallographic axis of the semiconductor substrate and the insulating film is not formed in the stress control regions or an insulating film thinner than the insulating film covering the source region, the drain region and the gate electrode is formed in the stress control regions.

A second semiconductor device of the present invention including a MIS transistor includes: an active region formed in part of a surface of a semiconductor substrate; an isolation region formed in the surface of the semiconductor substrate to surround the active region; a gate electrode arranged such that its center in the gate width direction is located above the active region and its ends in the gate width direction overlap the isolation region; a source region and a drain region which are formed in the active region; an insulating film covering at least part of the gate electrode, the source region and the drain region; and a pair of stress control regions formed on the ends of the gate electrode in the gate width direction, wherein the MIS transistor includes the active region, the gate electrode, the source region and the drain region, the direction of the length of a channel connecting the source region and the drain region is parallel to the <100> crystallographic axis of the semiconductor substrate and the insulating film is not formed in the stress control regions or an insulating film thinner than the insulating film covering the part of the gate electrode, the source region and the drain region is formed in the stress control regions.

In the first and second semiconductor devices of the present invention, compressive stress is applied to the channel region of the MIS transistor. The compressive stress is increased in the gate width direction.

A first method for manufacturing a semiconductor device of the present invention includes the steps of: (a) forming a gate electrode on an active region provided in a surface of a semiconductor substrate and forming a source region and a drain region in the active region to obtain a MIS transistor; (b) forming an insulating film on part of the surface of the semiconductor substrate where the active region is not formed, the gate electrode, the source region and the drain region; (c) providing a mask on a top surface of the insulating film such that a pair of parts of the top surface of the insulating film sandwiching the gate electrode in the gate width direction of the gate electrode are exposed; (d) performing etching after the step (c) to remove or reduce the thickness of the exposed parts of the insulating film; and (e) depositing an interlayer insulating film on the insulating film after the step (d).

A second method for manufacturing a semiconductor device of the present invention includes the steps of: (f) forming a gate electrode on an active region provided in a surface of a semiconductor substrate and forming a source region and a drain region in the active region to obtain a MIS transistor; (g) forming an insulating film on part of the surface of the semiconductor substrate where the active region is not formed, the gate electrode, the source region and the drain region; (h) forming an interlayer insulating film on the insulating film; (i) forming a pair of holes in parts of a top surface of the interlayer insulating film sandwiching the gate electrode in the gate width direction of the gate electrode to penetrate the interlayer insulating film and the insulating film; and (j) filling the pair of holes with second insulating material or metal having compressive stress different from that of the insulating film.

According to the first and second manufacturing methods of the present invention, a semiconductor device is provided with increased compressive stress in the gate width direction.

DETAILED DESCRIPTION OF THE INVENTION

Depending on which crystallographic axis direction of the substrate the channel length direction of the MIS transistors is substantially parallel to, not only the carrier mobility in a less-distorted silicon crystal but also the response of the carrier mobility to the stress may possibly vary. Specifically, when tensile stress is applied in a certain direction, the carrier mobility increases in transistors whose channel length direction is substantially parallel to the <110> crystallographic axis direction of the substrate (hereinafter referred to as <110> channel transistors). In contrast, the carrier mobility may possibly decrease in transistors whose channel length direction is substantially parallel to the <100> crystallographic axis direction of the substrate (hereinafter referred to as <100> channel transistors).

Figure 11A:
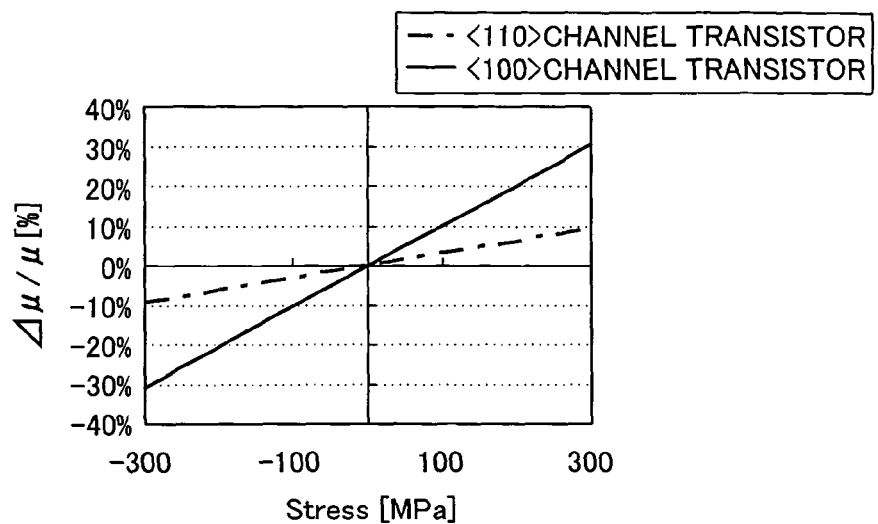
FIG. 11A is a graph illustrating stress-dependence of carrier mobility in an n-type MIS transistor having the channel length direction parallel to the <110> crystallographic axis direction and an n-type MIS transistor having the channel length direction parallel to the <100> crystallographic axis direction on a (100) Si wafer.
Figure 11B:
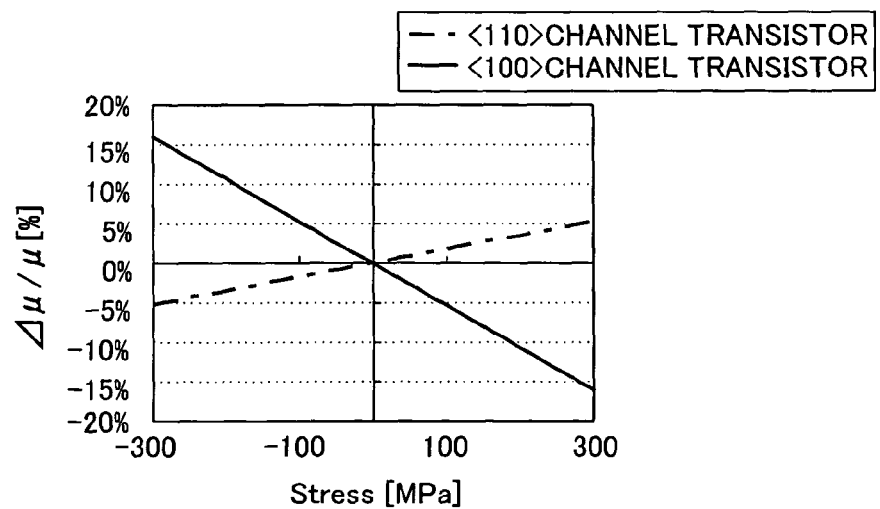
FIG. 11B is a graph illustrating another stress-dependence of carrier mobility in the n-type MIS transistor having the channel length direction parallel to the <110> crystallographic axis direction and the n-type MIS transistor having the channel length direction parallel to the <100> crystallographic axis direction on the (100) Si wafer.
Figure 11C:
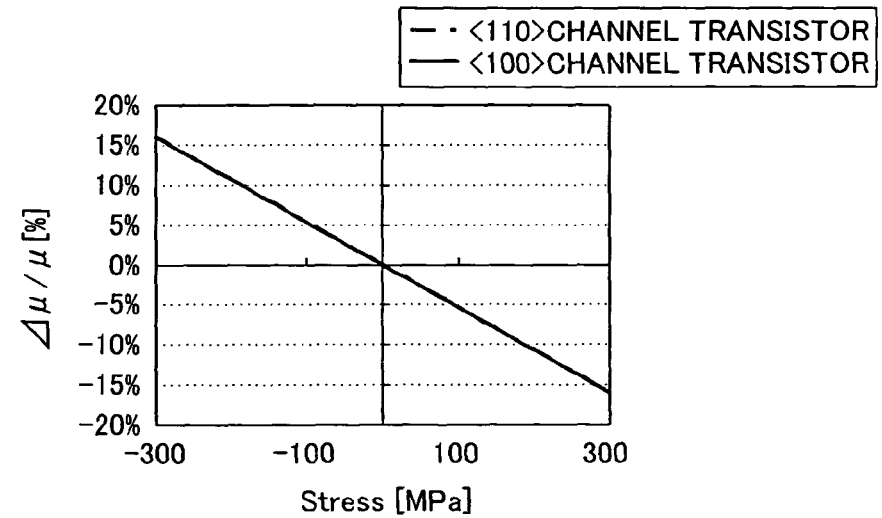
FIG. 11C is a graph illustrating still another stress-dependence of carrier mobility in the n-type MIS transistor having the channel length direction parallel to the <110> crystallographic axis direction and the n-type MIS transistor having the channel length direction parallel to the <100> crystallographic axis direction on the (100) Si wafer.

FIGS. 11A to 11C are graphs each illustrating stress-dependence of carrier mobility in the <110> and <100> channel transistors provided on a Si wafer having a (100) crystal plane as a principal surface. FIG. 11A shows the dependence of carrier mobility in response to stress parallel to the channel length direction, FIG. 11B shows the dependence of carrier mobility on stress parallel to a gate width direction and FIG. 11C shows the dependence of carrier mobility on stress vertical (perpendicular) to the channel. In every graph, the longitudinal axis indicates the rate of change in carrier mobility and the lateral axis indicates the stress applied to the MIS transistors. Plus and minus on the longitudinal axis refer to tensile stress and compressive stress, respectively.

As shown in FIG. 11A, the carrier mobility increases both in the <110> and <100> channel transistors with the increase in tensile stress in the channel length direction. The rate of change in carrier mobility in response to the tensile stress in the channel length direction is higher in the <100> channel transistors than in the <110> channel transistors.

As shown in FIG. 11B, with the increase in tensile stress in the gate width direction, the carrier mobility increases in the <110> channel transistors, while it decreases in the <100> channel transistors. If the crystallographic axis of the substrate is varied, the dependence of the carrier mobility on the tensile stress in the gate width direction is reversed.

Further, as shown in FIG. 11C, the carrier mobility decreases both in the <110> and <100> channel transistors with the increase in tensile stress vertical to the channel. The <110> channel transistors and <100> channel transistors show substantially the same rate of change in carrier mobility in response to the tensile stress vertical to the channel.

When a stress control film having internal tensile stress is deposited on the <100> channel transistors, the carrier mobility is increased by the tensile stress in the channel length direction, while it is reduced by the tensile stress in the gate width direction. As a result, the changes in carrier mobility are cancelled. This may possibly negate the effect of improvement in current characteristics.

In the following first to third embodiments, current characteristics are effectively improved in a semiconductor device having n-type MIS transistors arranged to have the channel length direction substantially parallel to the <100> crystallographic axis direction of the substrate. However, it should be noted that the present invention is not limited to these embodiments.

First Embodiment

Figure 1A:
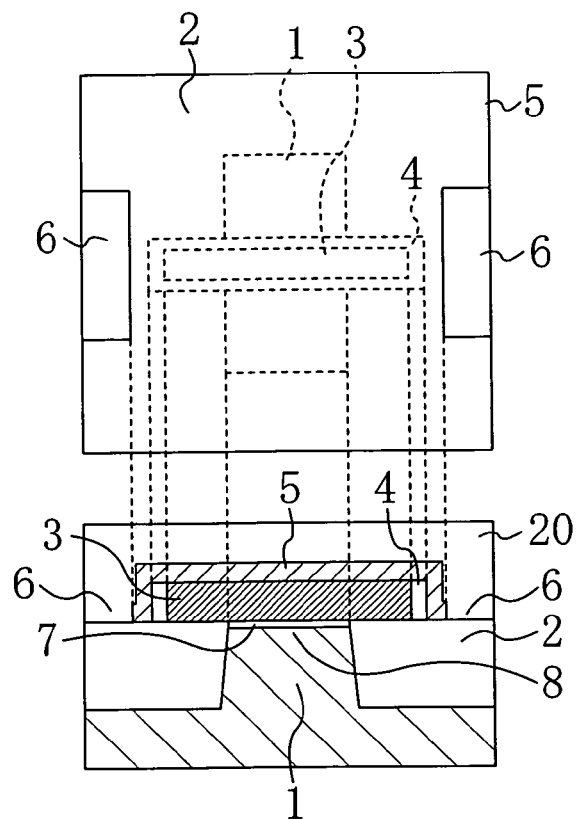
FIG. 1A shows top and sectional views schematically illustrating a semiconductor device of a first embodiment.

FIG. 1A schematically shows top and sectional views of a semiconductor device according to a first embodiment of the present invention. As shown in FIG. 1A, the semiconductor device of the present embodiment includes an active region 1 and an isolation region 2 formed in the surface of a silicon semiconductor substrate. The silicon semiconductor substrate has a (100) crystal plane as a principal surface. A MIS transistor is provided in the active region 1 and the isolation region 2 surrounds the active region 1.

A gate insulating film 7 and a gate electrode 3 are formed on the active region 1 in this order. The side surfaces of the gate electrode 3 are covered with sidewalls 4, respectively, and the gate electrode 3, the sidewalls 4 and the gate insulating film 7 constitute the MIS transistor. The gate insulating film 7 is preferably made of a silicon oxide film or a silicon oxide nitride film and the gate electrode 3 is preferably made of a silicide layer such as $NiSi_2$ or a conductive polysilicon layer. The sidewalls 4 are preferably made of an insulating film such as an oxide film or a silicon nitride film.

In part of the active region 1 located below the gate electrode 3, a channel region 8 for the MIS transistor is formed. Further, source and drain regions are formed in end portions of the active region 1 in the gate length direction of the gate electrode 3 (vertical direction in FIG. 1A).

A stress control film (insulating film) 5 is formed to cover part of the active region 1 where the gate electrode 3 is not provided, the isolation region 2, the top surface of the gate electrode 3 and the sidewalls 4. The stress control film 5 is preferably made of an insulating film having internal tensile stress of about 0.1 to several GPa (e.g., a silicon nitride film). In some cases, the stress control film 5 is used as an etch stopper in the step of forming contacts connecting the MIS transistor and a wiring layer.

On the surface of the silicon semiconductor substrate, a pair of stress control regions 6 are defined in addition to the active region 1 and the isolation region 2. The pair of stress control regions 6 are arranged to sandwich the gate electrode 3 in the gate width direction of the gate electrode 3 (horizontal direction of FIG. 1A). In the pair of stress control region 6, the stress control film 5 is not formed or another stress control film 5 thinner than the stress control film 5 covering the isolation region 2 and the like is formed. The provision of the stress control regions 6 makes it possible to increase the carrier mobility.

An interlayer insulating film 20 is formed on the stress control film 5 and the stress control regions 6. The interlayer insulating film 20 has internal tensile stress lower than that of the stress control film 5.

Hereinafter, detailed explanation of the stress control regions 6 is provided. For example, the stress control regions 6 and the channel region 8 (or the gate electrode 3) have a distance of 1 µm or smaller therebetween in the gate width direction of the gate electrode 3. The width of the stress control regions 6 in the gate width direction is preferably about 50 nm or longer.

The pair of stress control regions 6 are preferably not formed on the active region 1, the isolation region 2 and the channel region 8. If the stress control regions 6 are formed on the active region 1, the isolation region 2 and the channel region 8, tensile stress in the channel length direction (gate length direction) decreases, thereby leading to reduction in carrier mobility.

The width of the stress control regions 6 in the channel length direction is preferably larger than the gate length of the corresponding MIS transistor. With this structure, uniform compressive stress in the channel width direction is applied to the channel region of the MIS transistor.

Figure 1B:
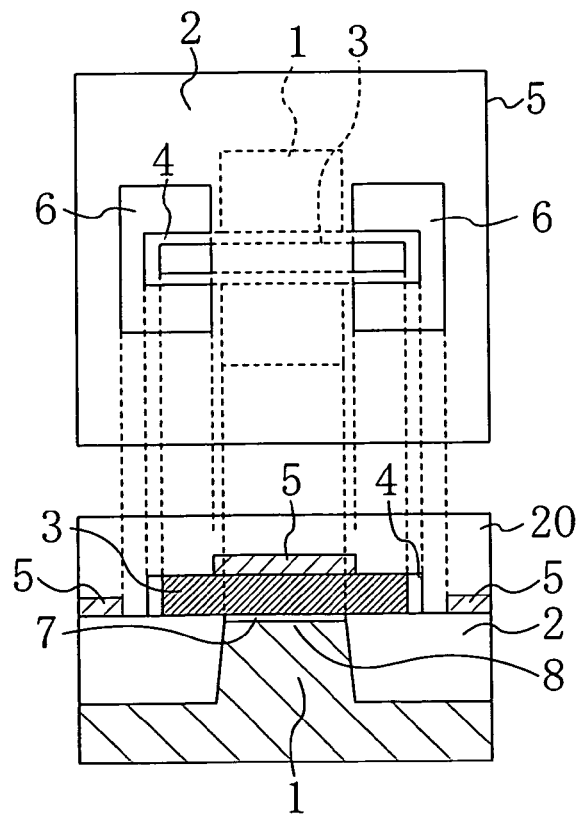
FIG. 1B shows top and sectional views schematically illustrating a variant of the semiconductor device of the first embodiment.

FIG. 1B schematically shows top and sectional views of a variant of the semiconductor device of the present embodiment. The gate electrode 3 is arranged on the surface of the silicon semiconductor substrate such that its center in the gate width direction is located above the active region 1 and its ends in the gate width direction overlap the isolation region 2. The pair of stress control regions 6 are provided to cover parts of the gate electrode 3 overlapping the isolation region 2 (on the ends of the gate electrode 3 in the gate width direction), respectively, and further extend their sizes in the gate length direction of the gate electrode 3.

Figure 2:
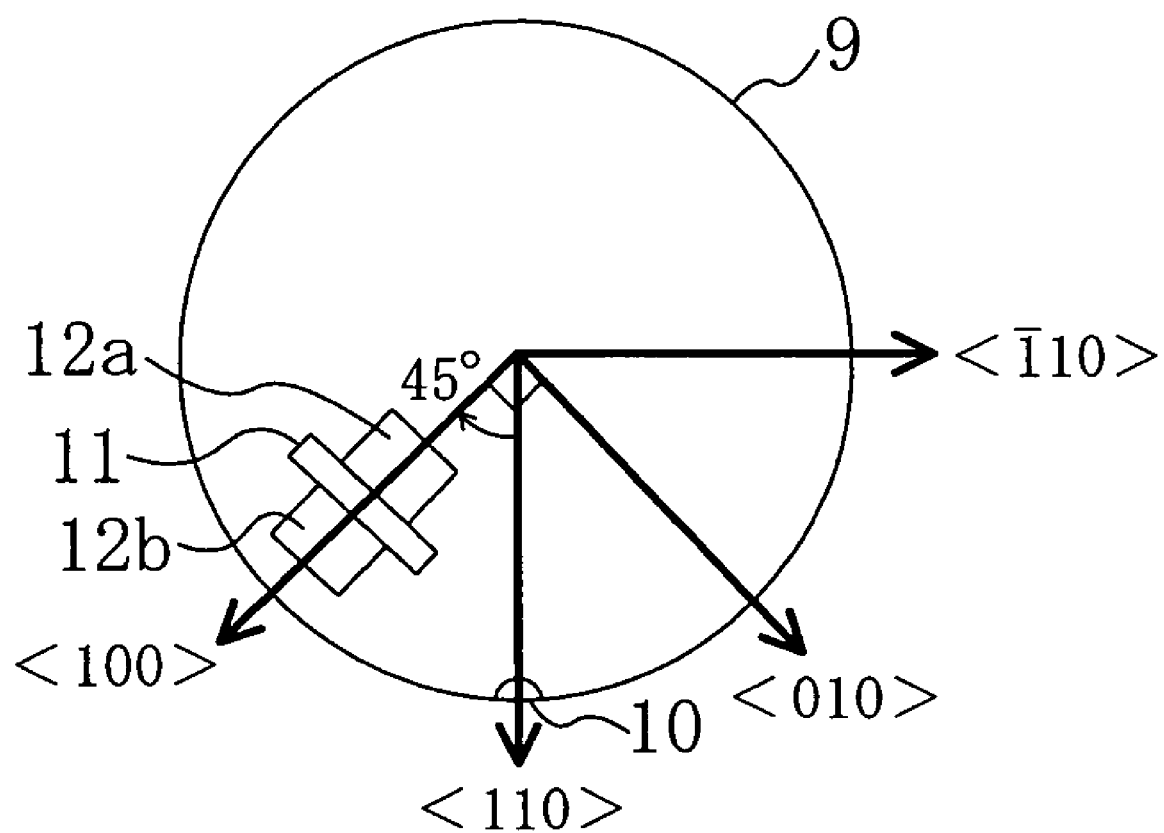
FIG. 2 is a plan view illustrating a Si wafer on which the semiconductor device of the first embodiment is formed.

FIG. 2 is a top view illustrating a Si wafer 9 on which the semiconductor devices of the present embodiment are formed. In general, a wafer having a <100> plane direction is used as the Si wafer 9. As shown in FIG. 2, the Si wafer 9 has a wafer notch 10 in the <110> crystallographic axis direction.

A source region 12a, a drain region 12b and a gate region 11 are formed on the wafer 9. The channel length direction connecting the source and drain regions 12a and 12b is along the <100> crystallographic axis shifted from the <110> crystallographic axis by 45°, or parallel to the <100> crystallographic axis. In the specification, the <100> crystallographic axis is a generic term used to refer to [100], [010], [001], [−100], [0-10] and [00-1]. The <100> crystallographic axis includes crystallographic axes which are shifted from the <100> crystallographic axis by an angle not larger than 10°.

FIGS. 3A to 5B show the results of stress simulation on the semiconductor devices of the present embodiment and conventional semiconductor devices. The simulation was performed with a three-dimensional process simulator HySyproS manufactured by Semiconductor Leading Edge Technologies, Inc.

Figure 3A:
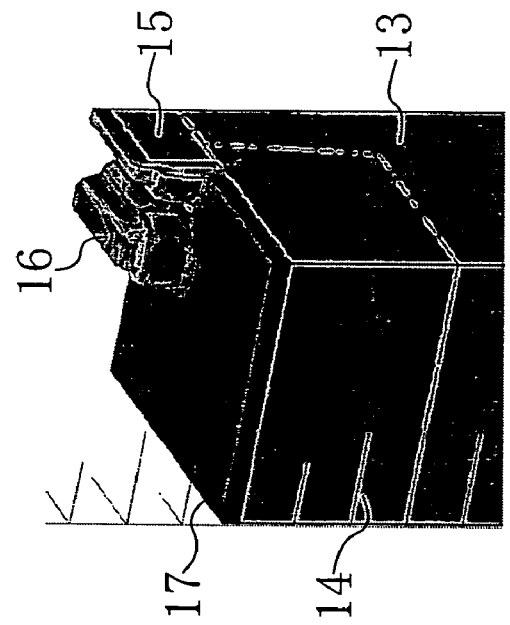
FIG. 3A is a structural diagram illustrating stress simulation on the semiconductor device of the first embodiment, together with a schematic top view thereof.
Figure 3A:
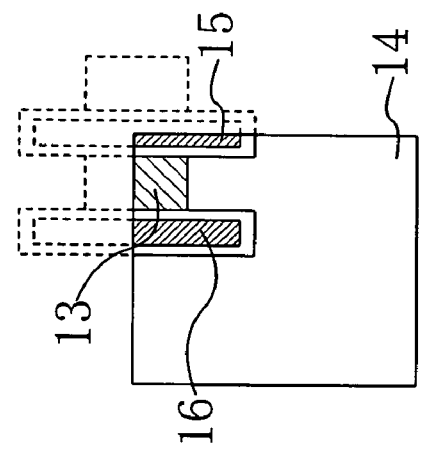
Figure 3B:
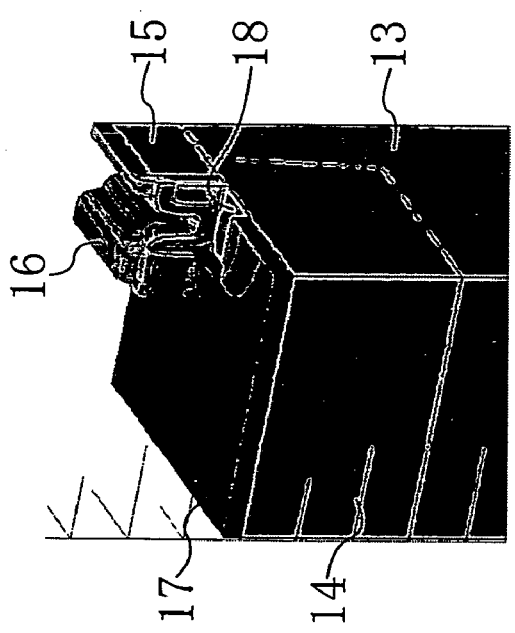
FIG. 3B is a structural diagram illustrating stress simulation on a conventional semiconductor device, together with a schematic top view thereof.
Figure 3B:
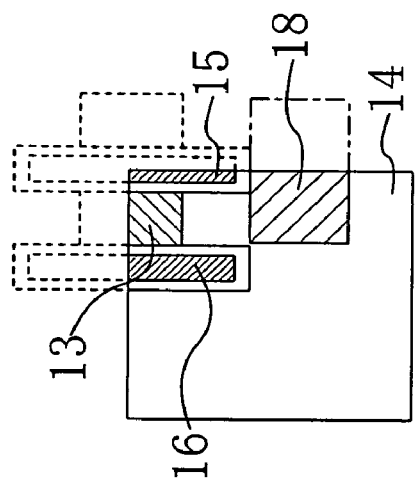

The analysis was performed on a quarter of the MIS transistor. In FIGS. 3A and 3B, analyzed area was indicated by solid lines. If each of the structures shown in FIGS. 3A and 3B is flipped relative to the side surfaces as planes of symmetry, the MIS transistor of the present embodiment and the conventional MIS transistors are shown. The MIS transistors have W/L=0.4/0.06 µm.

FIG. 3A shows a diagram illustrating 3-D simulated structure of the semiconductor device of the present embodiment including stress control regions 18 provided in an isolation region 14, together with a top view thereof. The structure shown in FIG. 3A includes an active region 13, an isolation region 14, a gate electrode 15 and adjacent gate electrode 16. The active region 13 is where the MIS transistor is formed and sandwiched between the gate electrode 15 and the adjacent gate electrode 16 in the gate length direction. A stress control film 17 is deposited on the isolation region 14 and the gate electrode 15 and the adjacent gate electrode 16. Further, stress control regions 18 are formed on parts of the top surface of the structure shown in FIG. 3A sandwiching the gate electrode 15 in the gate width direction of the gate electrode 15. The stress control film 17 is not formed in the stress control regions 18. Each of the stress control regions 18 is 0.2 µm×0.2 µm in size and has a distance of about 0.2 µm from the end of the channel region in the gate width direction.

FIG. 3B shows a diagram illustrating 3-D simulated structure of the conventional semiconductor device having no stress control regions in the isolation region 14, together with a top view thereof. The difference between FIGS. 3A and 3B is whether the stress control regions are provided or not.

Figure 4A:
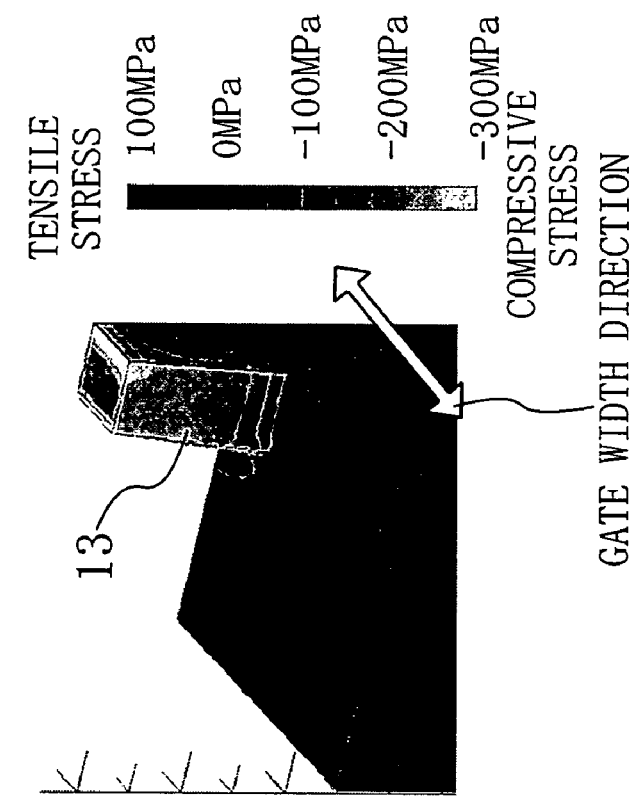
FIG. 4A is a diagram illustrating the results of the stress simulation on the semiconductor device of the first embodiment.
Figure 4B:
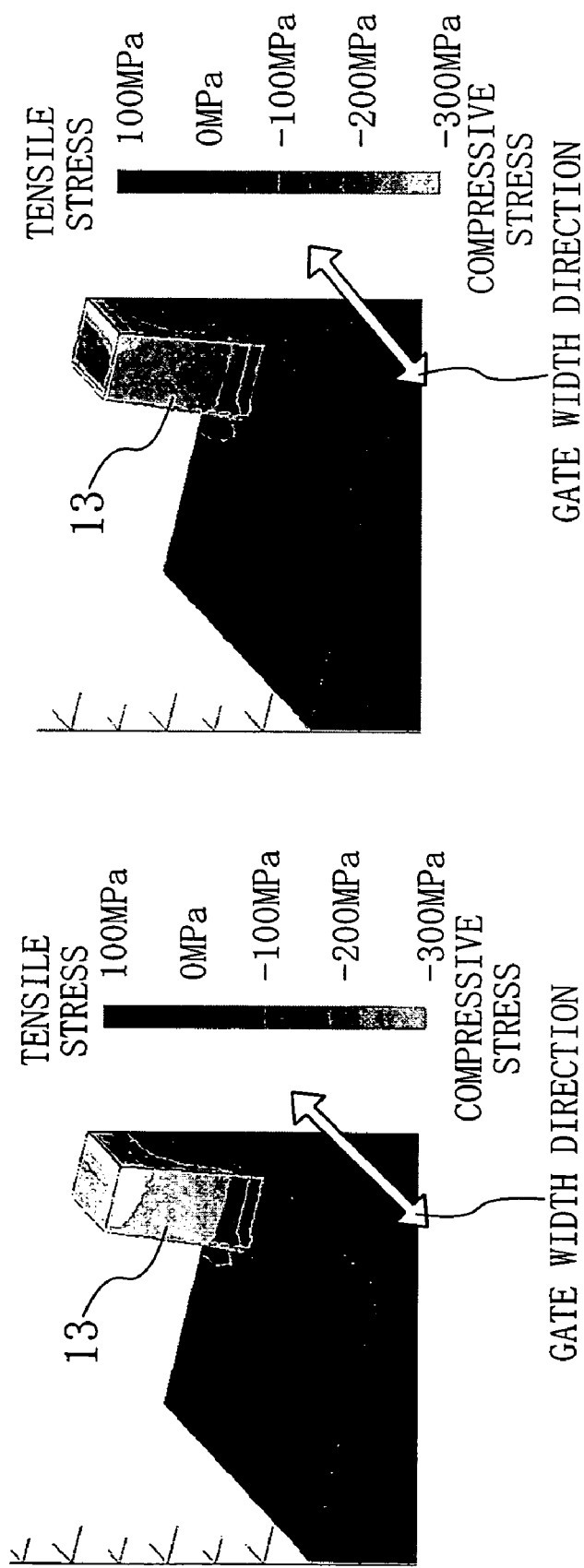
FIG. 4B is a diagram illustrating the results of the stress simulation on the conventional semiconductor device.

FIGS. 4A and 4B are diagrams showing stress distributions in the gate width direction in the semiconductor device of the present embodiment and the conventional semiconductor device, respectively. Only the Si substrate is shown in FIGS. 4A and 4B and other components such as the isolation region 14 are omitted. Referring to FIGS. 4A and 4B, projections are active regions 13 of the MIS transistors and arrows indicate the direction of measured stress (gate width direction). The darker scale signifies higher tensile stress and the lighter scale signifies lower compressive stress.

According to the results shown in FIG. 4A, the compressive stress in the active region 13 is higher than that shown in FIG. 4B. To be more specific, with the provision of the stress control regions 18, the compressive stress in the gate width direction is made higher than that in the device without the stress control regions 18. Due to the presence of the stress control regions 18, the compressive stress in the channel region (not shown) is increased by about 100 MPa at the maximum as compared with that in the device without the stress control regions 18.

Figure 5A:
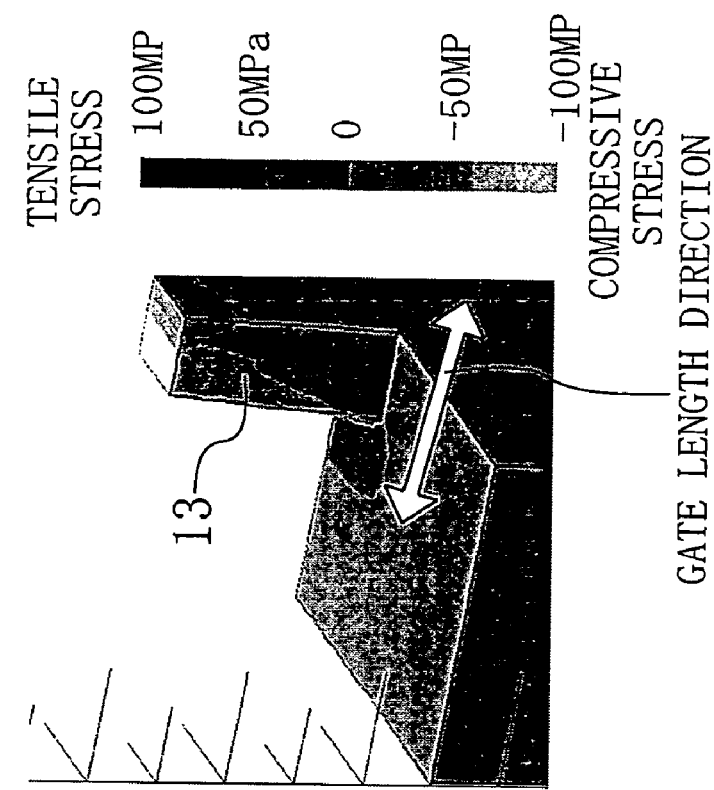
FIG. 5A is a diagram illustrating another results of the stress simulation on the semiconductor device of the first embodiment.
Figure 5B:
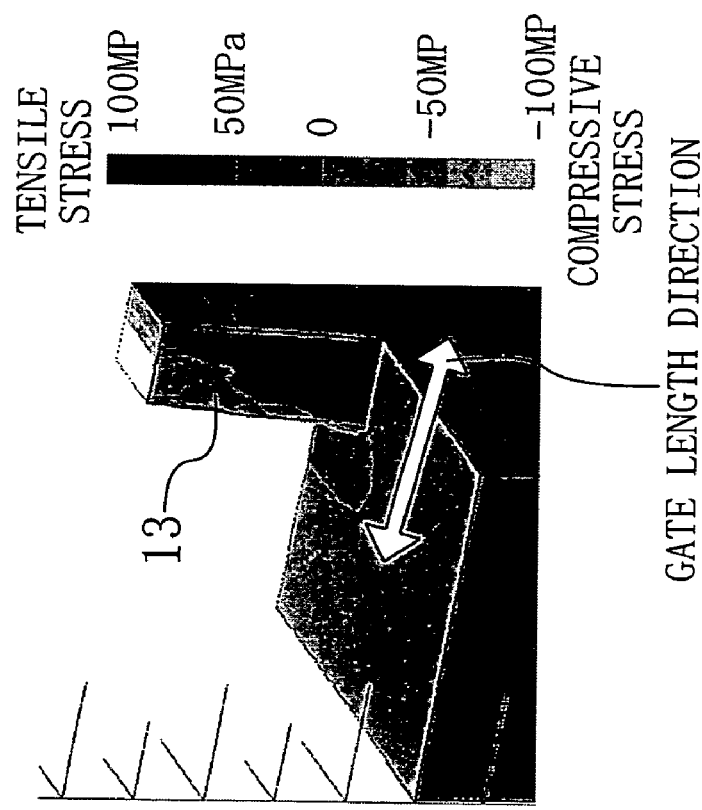
FIG. 5B is a diagram illustrating another results of the stress simulation on the conventional semiconductor device.

FIGS. 5A and 5B are diagrams showing stress distributions in the gate length direction in the semiconductor device of the present embodiment and the conventional semiconductor device, respectively. As shown in FIGS. 5A and 5B, there is not so much of a difference in stress in the gate length direction between the semiconductor device of the present embodiment and the conventional semiconductor device.

The above-described results indicate that the provision of the stress control regions 18 makes it possible to increase only the compressive stress in the gate width direction without significant decrease in tensile stress in the gate length direction.

Figure 6A:
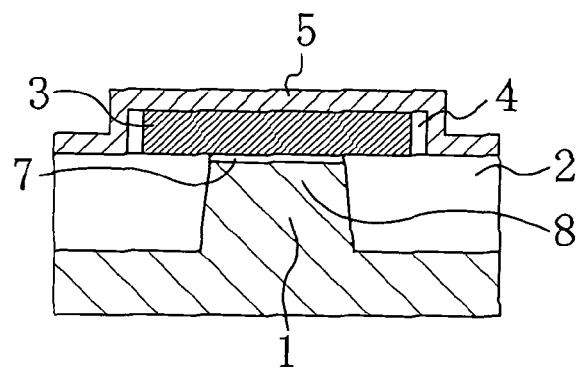
FIG. 6A is a sectional view illustrating some of the steps of manufacturing the semiconductor device of the first embodiment.
Figure 6B:
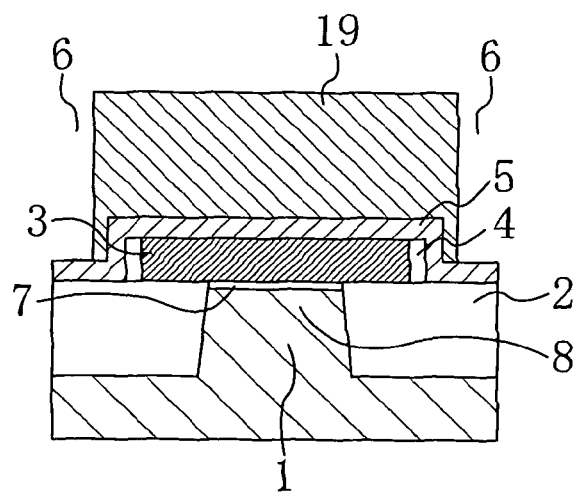
FIG. 6B is a sectional view illustrating another some of the steps of manufacturing the semiconductor device of the first embodiment.
Figure 6C:
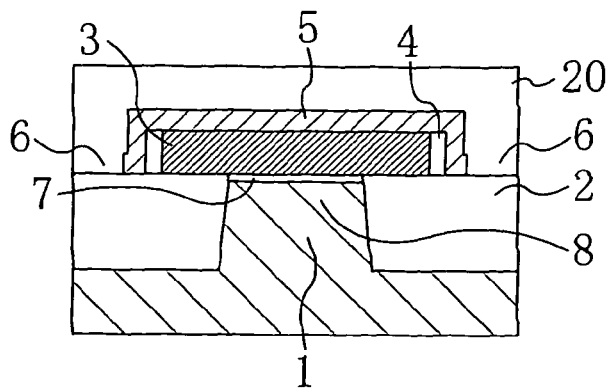
FIG. 6C is a sectional view illustrating another some of the steps of manufacturing the semiconductor device of the first embodiment.

FIGS. 6A to 6C are sectional views illustrating the steps of manufacturing the semiconductor device of the first embodiment.

First, a groove is formed in part of a (100) Si wafer and then filled with oxide to provide an active region 1 and an isolation region 2. Then, a gate insulating film 7 is formed on the surface of the active region 1 by thermal oxidation and a conductive polysilicon film is deposited on the gate insulating film 7, followed by mask patterning and anisotropic dry etching by lithography, to form a gate electrode 3. The direction of a channel connecting a source region and a drain region corresponding to the gate electrode 3 is brought parallel to the <100> crystallographic axis.

Using the gate electrode 3 as a mask, n-type impurities such as arsenic are ion-implanted into the Si wafer to form an n-type MIS transistor, or alternatively, p-type impurities such as boron are ion-implanted into the Si wafer to form a p-type MIS transistor. During this time, implantation energy is preferably about 1 to 10 KeV and a dose is preferably $1 \times 10^{13}$ to $1 \times 10^{14}$ cm$^{-2}$. Then, an insulating film for forming sidewalls is deposited to cover the top and side surfaces of the gate electrode 3 and then part of the insulating film deposited on the top surface of the gate electrode 3 is removed by dry etching to form sidewalls 4 covering the side surfaces of the gate electrode 3. Then, using the gate electrode 3 and the sidewalls 4 as a mask, n-type impurities such as arsenic are ion-implanted into the Si wafer to form an n-type MIS transistor, or alternatively, p-type impurities such as boron are ion-implanted into the Si wafer to form a p-type MIS transistor. During this time, implantation energy is preferably about 5 to 20 KeV and a dose is preferably $1 \times 10^{14}$ to $1 \times 10^{16}$ cm$^{-2}$. Thereafter, heat treatment is carried out to activate the implanted impurities (step (a)).

Subsequently, a silicide layer such as $NiSi_2$ or $CoSi_2$ is formed on the gate electrode 3 and the surface of the active region 1. Then, a stress control film 5 is formed to cover part of the active region 1 where the gate electrode 3 is not formed, the isolation region 2, the top surface of the gate electrode 3 and the sidewalls 4 (step (b)). The stress control film 5 may preferably be a silicon nitride film having internal tensile stress of 0.1 to several GPa and a thickness of about 20 to 50 nm. Thus, the structure shown in FIG. 6A is obtained.

Then, as shown in FIG. 6B, a resist film 19 is formed on the stress control film 5 by lithography and parts of the resist film 19 sandwiching the gate electrode 3 in the gate width direction of the gate electrode 3 are removed (step (c)).

Then, as shown in FIG. 6C, parts of the stress control film 5 where the resist film 19 is not formed (the parts from where the resist film 19 is removed in the step shown in FIG. 6B) are completely removed or thinned down (step (d)). As a result, stress control regions 6 are provided. Then, an interlayer insulating film 20 is deposited on the stress control film 5 and the stress control regions 6 (step (e)). The tensile stress of the interlayer insulating film 20 is preferably lower than that of the stress control film 5 by about 500 MPa or more. Through the above-described steps, the semiconductor device of the present embodiment is obtained.

Second Embodiment

Figure 7A:
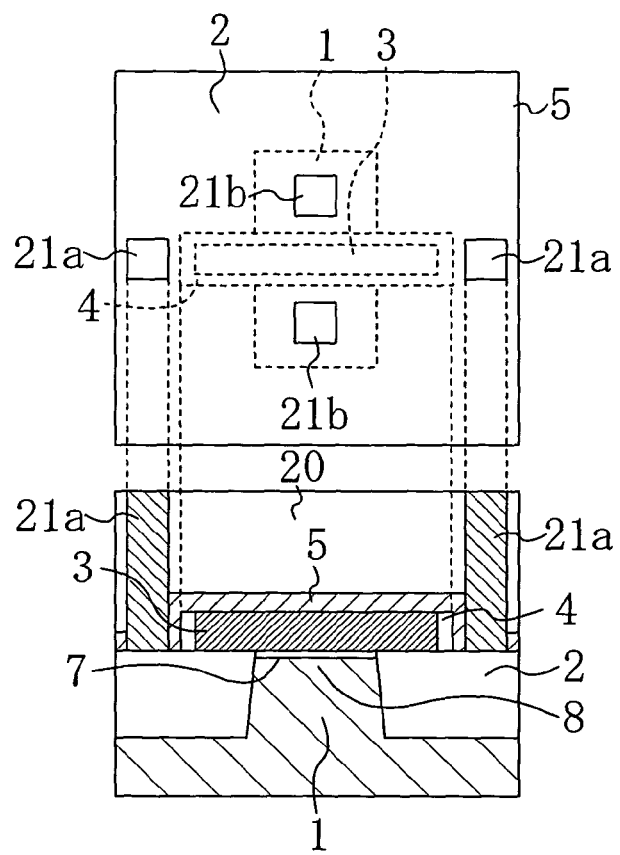
FIG. 7A shows top and sectional views schematically illustrating a semiconductor device of a second embodiment.

FIG. 7A schematically shows top and sectional views of a semiconductor device of a second embodiment. The difference between the present embodiment and the first embodiment is that a pair of stress-controlling contact plugs 21a are provided in place of the pair of stress control regions. The stress-controlling contact plugs 21a are preferably formed simultaneously with contact plugs (electrodes) 21b for electrical connection to wires on the upper level.

In the semiconductor device of the present embodiment, just like in that of the first embodiment, an active region 1 and an isolation region 2 for providing the MIS transistor are formed in the surface of a silicon semiconductor substrate having a (100) crystal plane as a principal surface. A gate insulating film 7 and a gate electrode 3 are formed on the active region 1 in this order. The side surfaces of the gate electrode 3 are covered with sidewalls 4, respectively. A channel region 8 of the MIS transistor is formed in part of the active region 1 below the gate electrode 3. The direction of the length of the channel connecting a source region and a drain region of the MIS transistor is parallel to the <100> crystallographic axis which is shifted from the <110> crystallographic axis by 45°.

A pair of stress-controlling contact plugs 21a and a pair of contact plugs 21b for electrical connection are formed on the isolation region 2. The pair of stress-controlling contact plugs 21a are arranged to sandwich the gate electrode 3 in the gate width direction of the gate electrode 3, while the contact plugs 21b are arranged to sandwich the gate electrode 3 in the gate length direction of the gate electrode 3. Both of the stress-controlling contact plugs 21a and the contact plugs 21b are made of metal preferably having internal tensile stress lower than that of the stress control film 5. The stress-controlling contact plugs 21a may not necessarily function as contact plugs for electrically connecting the wires on the upper level to the active region 1 or the gate electrode 3.

The stress control film 5 covers part of the active region 1 where the gate electrode 3 is not formed, part of the isolation region 2 where the pair of stress-controlling contact plugs 21a and the pair of contact plugs 21b are not formed, the top surface of the gate electrode 3 and the sidewalls 4. The stress control film 5 has internal tensile stress of about 0.1 to several GPa. An interlayer insulating film 20 is formed on the stress control film 5.

As described above, the stress control film 5 does not exist where the stress-controlling contact plugs 21a are formed. This structure makes it possible to increase the compressive stress in the gate width direction efficiently without significant decrease in tensile stress in the channel length direction of the channel region 8.

Figure 7B:
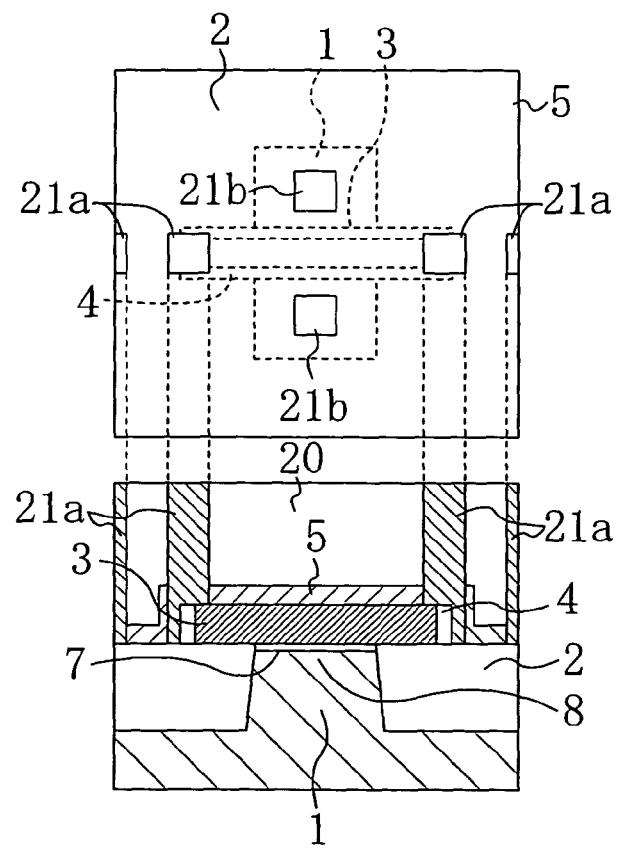
FIG. 7B shows top and sectional views schematically illustrating a variant of the semiconductor device of the second embodiment.

FIG. 7B schematically shows top and sectional views of a variant of the semiconductor device of the second embodiment. The gate electrode 3 is arranged on the surface of the silicon semiconductor substrate such that its center in the gate width direction is located above the active region 1 and its ends in the gate width direction overlap the isolation region 2. The pair of stress-controlling contact plugs 21a are formed on parts of the gate electrode 3 overlapping the isolation region 2, respectively. Alternatively, a plurality of stress-controlling contact plugs 21a may additionally be provided at intervals in the gate width direction to further enhance the compressive stress in the gate width direction.

Figure 8A:
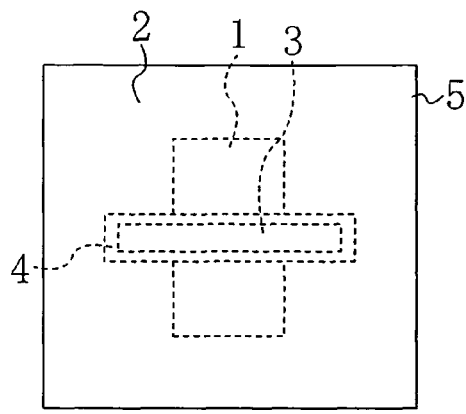
FIG. 8A shows top and sectional views illustrating some of the steps of manufacturing the semiconductor device of the second embodiment.
Figure 8B:
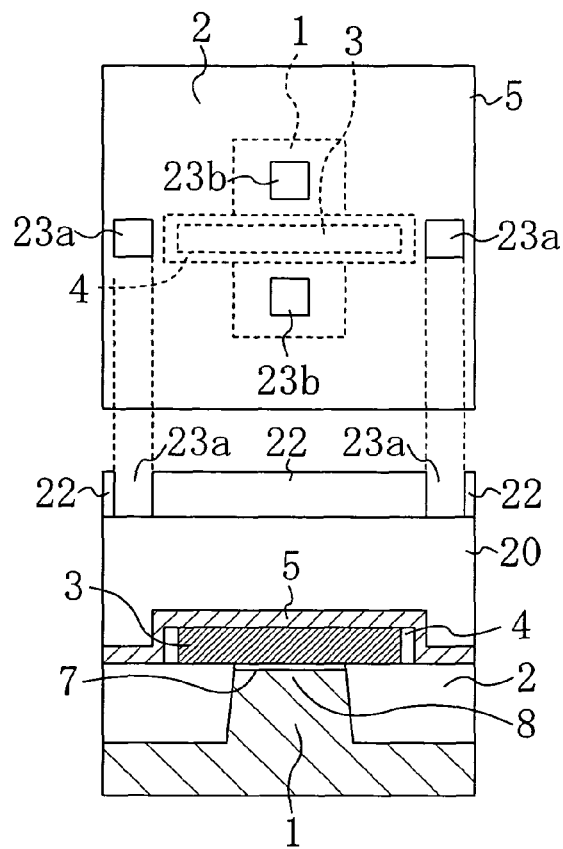
FIG. 8B shows top and sectional views illustrating another some of the steps of manufacturing the semiconductor device of the second embodiment.
Figure 8C:
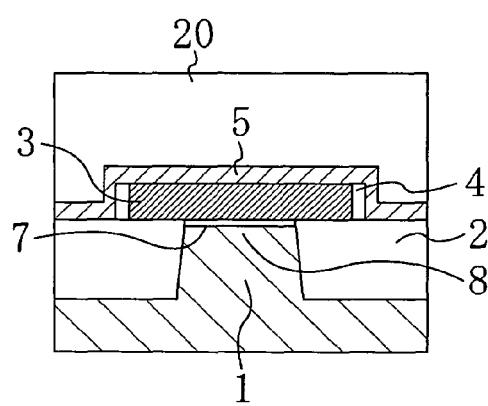
FIG. 8C shows top and sectional views illustrating another some of the steps of manufacturing the semiconductor device of the present embodiment.
Figure 8C:
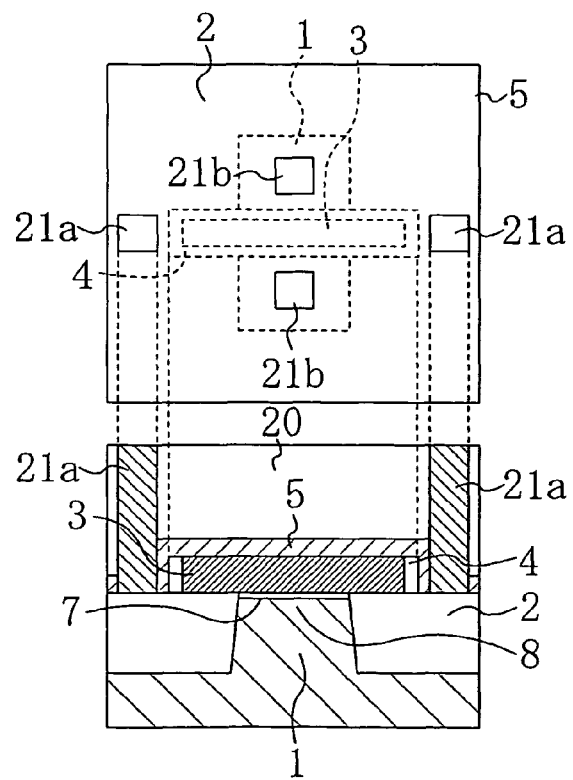

FIGS. 8A to 8C are top views and sectional views schematically illustrating the steps of manufacturing the semiconductor device of the present embodiment. First, in order to obtain the structure shown in FIG. 8A, an active region 1 and an isolation region 2 are formed in a (100) Si wafer used as the semiconductor substrate such that the channel direction is parallel to the <100> crystallographic axis. Then, a gate insulating film 7 and a gate electrode 3 are formed on the active region 1 in this order and sidewalls 4 are formed to cover the side surfaces of the gate electrode 3 (step (f)). Further, a stress control film 5 is deposited to cover part of the active region 1 where the gate electrode 3 is not formed, the isolation region 2, the top surface of the gate electrode 3 and the sidewalls 4 (step (g)). Up to this state, the method of the present embodiment is the same as that of the first embodiment. Subsequently, an interlayer insulating film 20 made of a silicon oxide film, such as NSG (non-doped silicate glass), BPSG (boron phosphorus silicon glass) or SOG (spin on glass), is deposited up to about a thickness of 30 nm (step (h)).

Then, as shown in FIG. 8B, a resist film 22 is formed on the interlayer insulating film 20 by lithography to pattern the resist film 22. In this step, a pair of first openings 23a and a pair of second openings 23b are formed in the resist film 22. To be more specific, the pair of first openings 23a are formed to be positioned above the isolation region 2 to sandwich the gate electrode 3 in the gate width direction. Further, the pair of second openings 23b are formed to be positioned above the active region 1 to sandwich the gate electrode in the gate length direction.

Then, as shown in FIG. 8C, the interlayer insulating film 20 and the stress control film 5 are dry-etched using the resist film 22 as a mask. As a result, parts of the interlayer insulating film 20 and the stress control film 5 above which the resist film 22 is not formed are removed, thereby providing a pair of first holes for forming the pair of stress-controlling contact plugs 21a and a pair of second holes for forming the pair of contact holes 21b for electrical connection (step (i)). Subsequently, metal such as tungsten is filled in the first and second holes by chemical vapor deposition or sputtering (step (j)). In this way, the stress-controlling contact plugs 21a and the contact plugs 21b are simultaneously formed. Thus, the stress-controlling contact plugs 21a and the contact plugs 21b are formed using a single mask.

According to the present embodiment, the desired stress-controlling contact plugs 21a are obtained by merely changing the layout of the openings formed in the mask for forming the contact plugs in the conventional process for manufacturing the semiconductor devices.

Third Embodiment

Figure 9A:
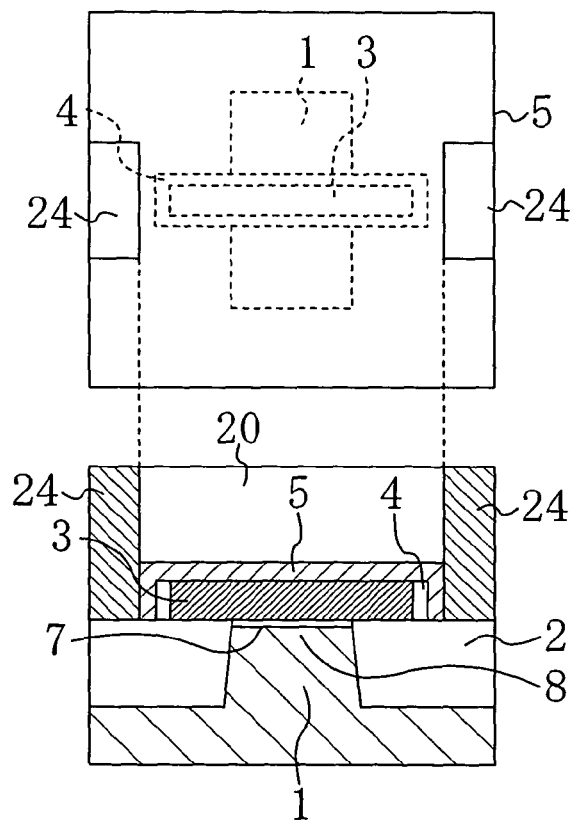
FIG. 9A shows top and sectional views schematically illustrating a semiconductor device of a third embodiment.

FIG. 9A schematically shows top and sectional views of a semiconductor device of a third embodiment. The present embodiment is different from the first embodiment in that an insulating film having higher compressive stress than that of the interlayer insulating film is deposited on the stress control regions in place of the interlayer insulating film.

In the semiconductor device of the present embodiment, just like in that of the first embodiment, an active region 1 and an isolation region 2 for providing the MIS transistor are formed in the surface of a silicon semiconductor substrate having a (100) crystal plane as a principal surface. A gate insulating film 7 and a gate electrode 3 are formed on the active region 1 in this order. The side surfaces of the gate electrode 3 are covered with sidewalls 4, respectively. A channel region 8 is formed in part of the active region 1 below the gate electrode 3. The direction of the length of the channel connecting a source region and a drain region of the MIS transistor is parallel to the <100> crystallographic axis which is shifted from the <110> crystallographic axis by 45°.

In the same manner as the first embodiment, a pair of stress control regions 26 are provided on parts of the surface of the silicon semiconductor substrate sandwiching the gate electrode 3 in the gate width direction of the gate electrode 3. An insulating film 24 (second insulating film) is formed in the stress control regions 26. The insulating film 24 has higher internal compressive stress than that of the stress control film 5. This structure makes it possible to achieve higher compressive stress in the gate width direction than that of the first embodiment.

The stress control film 5 is formed to cover part of the active region 1 where the gate electrode 3 is not formed, the isolation region 2, the gate electrode 3 and the sidewalls 4. The internal tensile stress of the stress control film 5 is preferably 0.1 to several GPa. An interlayer insulating film 20 is formed on the stress control film 5.

Figure 9B:
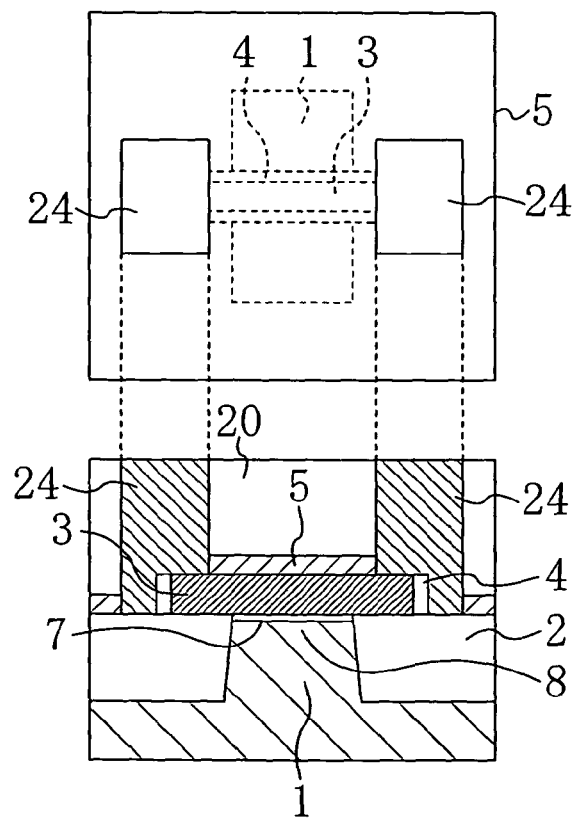
FIG. 9B shows top and sectional views schematically illustrating a variant of the semiconductor device of the third embodiment.

FIG. 9B schematically show top and sectional views of a variant of the semiconductor device of the present embodiment. The gate electrode 3 is arranged on the surface of the silicon semiconductor substrate such that its center in the gate width direction is located above the active region 1 and its ends in the gate width direction overlap the isolation region 2. The pair of stress control regions 26 are provided on parts of the gate electrode 3 formed on the isolation region 2 (on the ends of the gate electrode 3 in the gate width direction), respectively, and further extend their sizes in the gate length direction of the gate electrode 3. Also in this case, the insulating film 24 is formed in the stress control regions 26.

Figure 10A:
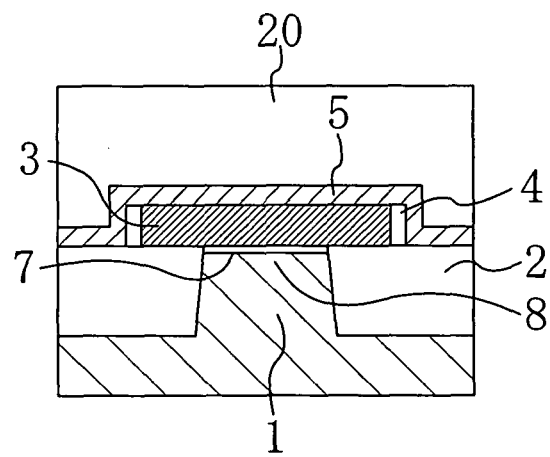
FIG. 10A is a sectional view illustrating some of the steps of manufacturing the semiconductor device of the third embodiment.
Figure 10B:
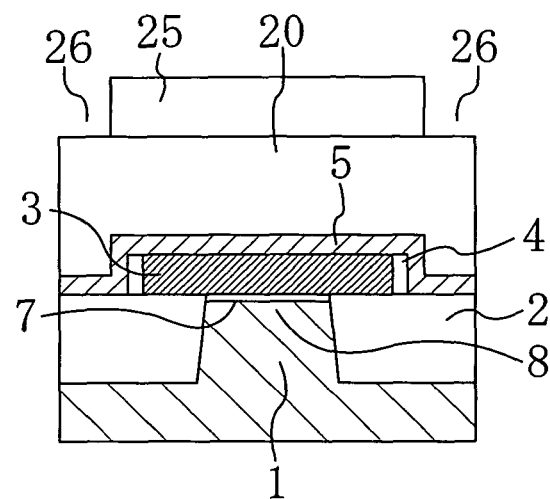
FIG. 10B is a sectional view illustrating another some of the steps of manufacturing the semiconductor device of the third embodiment.
Figure 10C:
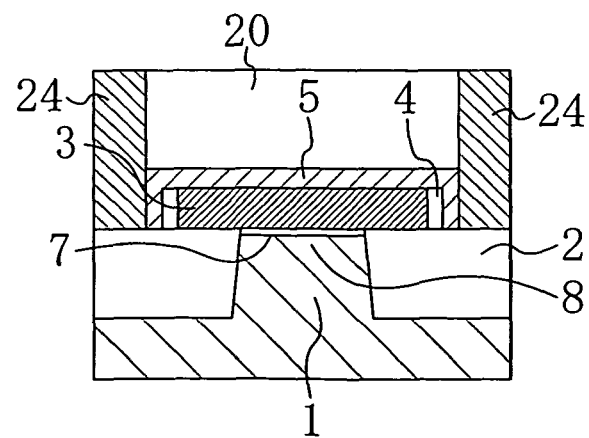
FIG. 10C is a sectional view illustrating another some of the steps of manufacturing the semiconductor device of the third embodiment.

FIGS. 10A to 10C are sectional views illustrating the steps of manufacturing the semiconductor device of the third embodiment. In the step shown in FIG. 10A, an active region 1 and an isolation region 2 are formed in a (100) Si wafer used as the semiconductor substrate such that the channel direction is parallel to the <100> crystallographic axis. Then, a gate insulating film 7 and a gate electrode 3 are formed on the active region 1 in this order and sidewalls 4 are formed to cover the side surfaces of the gate electrode 3 (step (f)). Further, a stress control film 5 is deposited to cover part of the active region 1 where the gate electrode 3 is not formed, the isolation region 2, the top surface of the gate electrode 3 and the sidewalls 4 (step (g)). Up to this stage, the method of the present embodiment is the same as that of the first embodiment.

Subsequently, an interlayer insulating film 20 made of a silicon oxide film, such as NSG, BPSG or SOG, is deposited up to a thickness of about 300 nm by chemical vapor deposition or sputtering (step (h)).

Then, in the step shown in FIG. 10B, a resist film 25 is formed on the interlayer insulating film 20 by lithography and patterning is carried out using the resist film 25 as a mask. Specifically, parts of the resist film 25 sandwiching the gate electrode 3 in the gate width direction of the gate electrode 3 are removed to obtain a patterned resist film 25.

Then, in the step shown in FIG. 10C, dry etching is carried out using the resist film 25 as a mask. As a result, a pair of holes are formed in parts of the interlayer insulating film 20 sandwiching the gate electrode 3 in the gate width direction of the gate electrode 3 to penetrate the interlayer insulating film 20 and the stress control film 5 (step (i)). During this time, it is preferred that part of the interlayer insulating film 20 not covered with the resist film 25 is completely removed. However, the part of the stress control film 5 not covered with the resist film 25 may be removed completely or thinned down. Thereafter, an insulating film 24 having high compressive stress of about 0.1 to several GPa is deposited on a region from where the interlayer insulating film 20 and the stress control film 5 are etched away (step (j)). With this structure, compressive stress in the gate width direction is applied from the insulating film, thereby improving the current characteristics of the MIS transistor to a further extent.

What is claimed is:

1. A semiconductor device comprising:
   a single MIS transistor including an active region formed in a semiconductor substrate, a gate electrode formed on the active region, and source and drain regions formed in the active region;
   a stress control film being in direct contact with the semiconductor substrate, the source region, the drain region, and the gate electrode, and covering the semiconductor substrate, the source region, the drain region, and the gate electrode; and
   an interlayer insulating film stacked on the stress control film to be in direct contact with the stress control film, wherein:
   a direction of length of a channel connecting the source region and the drain region is parallel to the <100> crystallographic axis of the semiconductor substrate,
   the stress control film has a pair of openings formed to sandwich the gate electrode of only the single MIS transistor such that both ends of the gate electrode in a gate width direction are located between the pair of openings when viewed in plan, and
   the interlayer insulating film and the semiconductor substrate are in direct contact with each other in the pair of openings.

2. The semiconductor device of claim 1, further comprising:
   an isolation region formed in a region surrounding the active region in the semiconductor substrate, and
   the pair of openings are formed on the isolation region.

3. The semiconductor device of claim 1, wherein
   the active region is formed in the semiconductor substrate around a surface of the semiconductor substrate.

4. The semiconductor device of claim 1, wherein
   the pair of openings are longer than the gate electrode in a gate length direction of the gate electrode.

5. The semiconductor device of claim 1, wherein the single MIS transistor is an n-channel type MIS transistor.

6. The semiconductor device of claim 1, wherein the stress control film is an insulating film.

* * * * *